US012650937B2

(12) United States Patent
Lee

(10) Patent No.: US 12,650,937 B2
(45) Date of Patent: Jun. 9, 2026

(54) MEMORY MODULE OPERABLE TO PROVIDE DISTINCT SIGNALING INTERFACES VIA AN OPEN-DRAIN OUTPUT FOR DISTINCT OPERATIONS

(71) Applicant: Netlist, Inc., Irvine, CA (US)

(72) Inventor: Hyun Lee, Ladera Ranch, CA (US)

(73) Assignee: Netlist, Inc., Irvine, CA (US)

( * ) Notice: Subject to any disclaimer, the term of this patent is extended or adjusted under 35 U.S.C. 154(b) by 0 days.

(21) Appl. No.: 18/413,017

(22) Filed: Jan. 15, 2024

(65) Prior Publication Data

US 2024/0232105 A1 Jul. 11, 2024

Related U.S. Application Data

(63) Continuation of application No. 17/840,593, filed on Jun. 14, 2022, now Pat. No. 11,880,319, which is a
(Continued)

(51) Int. Cl.
*G06F 12/00* (2006.01)
*G06F 3/06* (2006.01)
(Continued)

(52) U.S. Cl.
CPC ........ *G06F 13/1694* (2013.01); *G06F 3/0619* (2013.01); *G06F 3/0632* (2013.01);
(Continued)

(58) Field of Classification Search
CPC ............. G06F 13/1694; G06F 12/0646; G06F 3/0619; G06F 11/1068; G06F 3/0673;
(Continued)

(56) References Cited

U.S. PATENT DOCUMENTS 3,414,781 A 12/1968 Dill
3,560,935 A 2/1971 Beers
(Continued)

OTHER PUBLICATIONS

Inter Partes Review Case No. IPR2017-00548, Petition for Inter Partes Review of U.S. Pat. No. 8,489,837, filed Dec. 30, 2016.
(Continued)

*Primary Examiner* — Mardochee Chery
(74) *Attorney, Agent, or Firm* — USCH Law, PC

(57) ABSTRACT

A memory subsystem is operable with a memory controller of a host computer system via an interface. The memory subsystem comprises dynamic random access memory elements and a memory subsystem controller. The memory subsystem controller has an open drain output, and is configured to provide a first signaling interface via the open drain output during normal operations and a second signaling interface via the open drain output during an initialization operation. The second signaling interface is distinct from the first signaling interface and the initialization operation is distinct from any of the normal operations. The first signaling interface is used by the memory subsystem controller to indicate a parity error in response to a parity error having occurred during the normal operations. The second signaling interface is used by the memory subsystem controller to output a signal related to initialization operation sequences during the initialization operation.

19 Claims, 3 Drawing Sheets

Related U.S. Application Data continuation of application No. 16/680,060, filed on Nov. 11, 2019, now Pat. No. 11,386,024, which is a continuation of application No. 15/857,553, filed on Dec. 28, 2017, now Pat. No. 10,474,595, which is a continuation of application No. 15/088,155, filed on Apr. 1, 2016, now Pat. No. 9,667,001, which is a continuation of application No. 13/942,721, filed on Jul. 16, 2013, now Pat. No. 9,311,116, which is a continuation of application No. 12/815,339, filed on Jun. 14, 2010, now Pat. No. 8,489,837.

(60) Provisional application No. 61/186,799, filed on Jun. 12, 2009.

(51) Int. Cl.

| | |
|---|---|
| G06F 9/445 | (2018.01) |
| G06F 11/10 | (2006.01) |
| G06F 12/06 | (2006.01) |
| G06F 13/16 | (2006.01) |
| G06F 13/24 | (2006.01) |
| G11C 5/04 | (2006.01) |
| G11C 7/10 | (2006.01) |
| G11C 29/52 | (2006.01) |
| G11C 5/00 | (2006.01) |
| G11C 16/26 | (2006.01) |
| G11C 29/00 | (2006.01) |
| G11C 29/44 | (2006.01) |

(52) U.S. Cl.
CPC .......... G06F 3/0659 (2013.01); G06F 3/0673 (2013.01); G06F 9/445 (2013.01); G06F 11/1068 (2013.01); G06F 12/0646 (2013.01); G06F 13/1668 (2013.01); G06F 13/24 (2013.01); G11C 5/04 (2013.01); G11C 7/1063 (2013.01); G11C 29/52 (2013.01); G11C 5/00 (2013.01); G11C 7/1066 (2013.01); G11C 16/26 (2013.01); G11C 2029/4402 (2013.01); G11C 29/78 (2013.01); G11C 2207/2254 (2013.01)

(58) Field of Classification Search
CPC ...... G06F 3/0659; G06F 3/0632; G06F 13/24; G06F 9/445; G06F 13/1668; G11C 29/52; G11C 7/1063; G11C 5/04; G11C 2029/4402; G11C 5/00; G11C 7/1066; G11C 16/26; G11C 29/78; G11C 2207/2254
USPC ........................................................ 711/154
See application file for complete search history.

(56) References Cited

U.S. PATENT DOCUMENTS

| | | | |
|---|---|---|---|
| 4,672,570 | A | 6/1987 | Benken |
| 5,388,074 | A | 2/1995 | Buckenmaier |
| 5,438,536 | A | 8/1995 | Salzman |
| 5,450,576 | A | 9/1995 | Kennedy |
| 5,511,152 | A | 4/1996 | Lai et al. |
| 5,606,662 | A | 2/1997 | Wisor |
| 5,684,979 | A | 11/1997 | Grimes |
| 5,835,733 | A | 11/1998 | Walsh et al. |
| 6,363,450 | B1 | 3/2002 | Lash et al. |
| 6,693,840 | B2 | 2/2004 | Shimada et al. |
| 6,754,787 | B2 | 6/2004 | Miller et al. |
| 6,763,437 | B1 | 7/2004 | Nguyen et al. |
| 6,886,109 | B2 | 4/2005 | Olarig et al. |
| 7,024,518 | B2 | 4/2006 | Halbert et al. |
| 7,065,688 | B1 | 6/2006 | Moyes et al. |
| 7,093,115 | B2 | 8/2006 | Poisner et al. |
| 7,155,579 | B1 | 12/2006 | Neils et al. |
| 7,221,699 | B1 | 5/2007 | Lindskog |
| 7,222,213 | B2 | 5/2007 | James |
| 7,266,633 | B2 | 9/2007 | James |
| 7,411,862 | B2 | 8/2008 | Hein et al. |
| 7,489,163 | B2 | 2/2009 | Goodnow et al. |
| 7,525,860 | B2 | 4/2009 | Hokenmaier |
| 7,539,909 | B2 | 5/2009 | LeClerg et al. |
| 7,568,130 | B2 | 7/2009 | Smith et al. |
| 7,586,350 | B2 | 9/2009 | Chung et al. |
| 7,647,467 | B1 | 1/2010 | Hutsell et al. |
| 7,757,101 | B2 | 7/2010 | Nonaka et al. |
| 8,054,664 | B2 | 11/2011 | Harashima et al. |
| 8,074,034 | B2 | 12/2011 | Sartore |
| 8,139,430 | B2 | 3/2012 | Buchmann et al. |
| 8,359,521 | B2 | 1/2013 | Kim et al. |
| 8,386,722 | B1 | 2/2013 | Wang et al. |
| 8,386,737 | B2 | 2/2013 | Jeon et al. |
| 8,402,208 | B2 | 3/2013 | Berke |
| 8,407,441 | B2 | 3/2013 | Giovannini et al. |
| 8,429,493 | B2 | 4/2013 | Sokolov et al. |
| 8,452,917 | B2 | 5/2013 | Amer et al. |
| 9,389,876 | B2 * | 7/2016 | Emma ................ G06F 11/3433 |
| 2003/0115427 | A1 | 6/2003 | Roohparvar |
| 2005/0071580 | A1 | 3/2005 | LeClerg et al. |
| 2005/0138302 | A1 | 6/2005 | Lusk et al. |
| 2005/0193161 | A1 | 9/2005 | Lee et al. |
| 2006/0062047 | A1 | 3/2006 | Bhakta et al. |
| 2006/0262586 | A1 | 11/2006 | Solomon et al. |
| 2006/0277355 | A1 | 12/2006 | Ellsberry et al. |
| 2007/0008791 | A1 | 1/2007 | Butt et al. |
| 2007/0091702 | A1 | 4/2007 | Nikitin et al. |
| 2007/0136523 | A1 | 6/2007 | Bonella et al. |
| 2007/0140030 | A1 * | 6/2007 | Wyatt ...................... G11C 5/00 365/212 |
| 2007/0214347 | A1 | 9/2007 | Rothman et al. |
| 2008/0098277 | A1 | 4/2008 | Hazelzet |
| 2008/0147897 | A1 | 6/2008 | Talbot |
| 2008/0155378 | A1 | 6/2008 | Amidi |
| 2008/0256281 | A1 | 10/2008 | Fahr et al. |
| 2009/0103373 | A1 | 4/2009 | Shau |
| 2009/0119464 | A1 | 5/2009 | Grundy et al. |
| 2010/0005218 | A1 | 1/2010 | Gower et al. |
| 2010/0042778 | A1 | 2/2010 | Tanguay et al. |
| 2010/0142383 | A1 | 6/2010 | Goishi et al. |
| 2010/0202240 | A1 | 8/2010 | Moshayedi et al. |
| 2011/0007585 | A1 | 1/2011 | Shan et al. |
| 2011/0022789 | A1 | 1/2011 | Fujimoto |

OTHER PUBLICATIONS

Inter Partes Review of U.S. Pat. No. 8,489,837, Case No. IPR2017-00548, Exhibit 1003 "Declaration of Donald Alpert", filed Dec. 30, 2016.

Inter Partes Review of U.S. Pat. No. 8,489,837, Case No. IPR2017-00548, Exhibit 1010 "5400 MCH Datasheet", filed Dec. 30, 2016.

Inter Partes Review of U.S. Pat. No. 8,489,837, Case No. IPR2017-00548, Exhibit 1011 "Microsoft Computer Dictionary (5th Ed. 2002)", filed Dec. 30, 2016.

Inter Partes Review of U.S. Pat. No. 8,489,837, Case No. IPR2017-00548, Patent Owner's Preliminary Response, filed Apr. 9, 2017.

Inter Partes Review of U.S. Pat. No. 8,489,837, Case No. IPR2017-00548, Trial Instituted document, dated May 15, 2017.

Inter Partes Review of U.S. Pat. No. 8,489,837, Case No. IPR2017-00548, Patent Owner's Response, filed Sep. 6, 2017.

Inter Partes Review of U.S. Pat. No. 8,489,837, Case No. IPR2017-00548, Exhibit 2001—Declaration of Robert J Murphy, filed Sep. 6, 2017.

Inter Partes Review of U.S. Pat. No. 8,489,837, Case No. IPR2017-00548, Exhibit 2002—Deposition of Donald Alpert, Ph.D., filed Sep. 6, 2017.

Inter Partes Review of U.S. Pat. No. 8,489,837, Case No. IPR2017-00548, Exhibit 2003—Defendants' Opening Claim Construction Brief, filed Sep. 6, 2017.

(56)           References Cited

OTHER PUBLICATIONS

Inter Partes Review of U.S. Pat. No. 8,489,837, Case No. IPR2017-00548, Exhibit 2004—Plaintiff Netlist, NC.'s Opening Claim Construction Brief, filed Sep. 6, 2017.
Inter Partes Review of U.S. Pat. No. 8,489,837, Case No. IPR2017-00548, Exhibit 2005—Plaintiff Netlist, NC.'s Amended Opening Claim Construction Brief, filed Sep. 6, 2017.
Inter Partes Review of U.S. Pat. No. 8,489,837, Case No. IPR2017-00548, Exhibit 2006—Defendants' Reply Claim Construction Brief, filed Sep. 6, 2017.
Inter Partes Review of U.S. Pat. No. 8,489,837, Case No. IPR2017-00548, Exhibit 2007—Plaintiff Netlist, NC.'s Responsive Claim Construction Brief, filed Sep. 6, 2017.
Inter Partes Review of U.S. Pat. No. 8,489,837, Case No. IPR2017-00548, Exhibit 2008—United States International Trade Commission Open Sessions, filed Sep. 6, 2017.
Inter Partes Review of U.S. Pat. No. 8,489,837, Case No. IPR2017-00548, Exhibit 2009—Computer Desktop Encyclopedia, filed Sep. 6, 2017.
Inter Partes Review of U.S. Pat. No. 8,489,837, Case No. IPR2017-00548, Deposition of Robert J. Murphy, filed Dec. 11, 2017.
Inter Partes Review of U.S. Pat. No. 8,489,837, Case No. IPR2017-00548, Petitioner's Reply to Patent Owner's Response, filed Dec. 13, 2017.
Inter Partes Review of U.S. Pat. No. 8,489,837, Case No. IPR2017-00548, Petitioner's Demonstratives, filed Feb. 9, 2018.
Inter Partes Review of U.S. Pat. No. 8,489,837, Case No. IPR2017-00548, Demonstratives of Patent Owner Netlist, Inc., filed Feb. 9, 2018.
Inter Partes Review of U.S. Pat. No. 8,489,837, Case No. IPR2017-00548, Record of Oral Hearing, held Feb. 14, 2018.
Inter Partes Review of U.S. Pat. No. 8,489,837, Case No. IPR2017-00548, Final Written Decision, entered May 3, 2018.
Inter Partes Review of U.S. Pat. No. 9,535,623, Case No. IPR2018-00303, Petition for Inter Partes Review of U.S. Pat. No. 9,535,623, filed Dec. 14, 2017.
Inter Partes Review of U.S. Pat. No. 9,535,623, Case No. IPR2018-00303, Exhibits 1003, 'Declaration of Donald Alpert,' filed Dec. 14, 2017.
Inter Partes Review of U.S. Pat. No. 9,535,623, Case No. IPR2018-00303, Exhibits 1003, 'Corrected Declaration of Donald Alpert,' filed Dec. 19, 2017.
Inter Partes Review of U.S. Pat. No. 9,535,623, Case No. IPR2018-00303, PO Preliminary Response, filed Mar. 19, 2018.
Inter Partes Review of U.S. Pat. No. 9,535,623, Case No. IPR2018-00303, Patent Owner's Response, filed Aug. 10, 2018.
Inter Partes Review of U.S. Pat. No. 9,535,623, Case No. IPR2018-00303, Petitioners' Reply to Patent Owner's Response, filed Nov. 9, 2018.
Inter Partes Review of U.S. Pat. No. 9,535,623, Case No. IPR2018-00303, Patent Owner Submission of ITC Claim Construction Order, filed Nov. 30, 2018.
Inter Partes Review of U.S. Pat. No. 9,535,623, Case No. IPR2018-00303, Patent Owner Reply to Petitioner Opposition to Motion to Exclude, filed Dec. 21, 2018.
Inter Partes Review of U.S. Pat. No. 9,535,623, Case No. IPR2018-00303, Patent Owner Demonstratives, filed Feb. 4, 2019.
Inter Partes Review of U.S. Pat. No. 9,535,623, Case No. IPR2018-00303, Petitioners' Demonstratives, filed Feb. 4, 2019.
Inter Partes Review of U.S. Pat. No. 9,535,623, Case No. IPR2018-00303, Trial Instituted Document, dated May 24, 2018.
Inter Partes Review of U.S. Pat. No. 9,535,623, Case No. IPR2018-00303, Hearing Transcript, filed Feb. 26, 2019.
Inter Partes Review of U.S. Pat. No. 9,535,623, Case No. IPR2018-00303, Exhibits 2001, Declaration of Robert J. Murphy, filed Mar. 19, 2018.
Inter Partes Review of U.S. Pat. No. 9,535,623, Case No. IPR2018-00303, Exhibits 2002, 'Bruce Jacob, Memory Systems—Cache, DRAM, Disk, 2008 by Elsevier Inc.,' filed Mar. 19, 2018 Inter Partes Review of U.S. Pat. No. 9,535,623, Case No. IPR2018-

00303, Exhibits 2004, 'Riser Card Tutorial, Orbit Micro News and Notes, Sep. 6, 2008,' filed Mar. 19, 2018.
Inter Partes Review of U.S. Pat. No. 9,535,623, Case No. IPR2018-00303, Exhibits 2005, 'Supplemental Declaration of Robert J. Murphy,' filed Aug. 10, 2018.
Inter Partes Review of U.S. Pat. No. 9,535,623, Case No. IPR2018-00303, Exhibits 2006, 'Deposition of Donald Alpert, Ph.D. on Jul. 20, 2018,' filed Aug. 10, 2018.
ITC Investigation No. 337-TA-1089, Joint List of Claim Terms for Construction, dated Mar. 12, 2018.
ITC Investigation No. 337-TA-1089, Order No. 17: Construing Terms of the Asserted Patents, dated Aug. 30, 2018.
ITC Investigation No. 337-TA-1089, Commission Opinion, dated Apr. 21, 2020.
Inter Partes Review of U.S. Pat. No. 9,535,623, Case No. IPR2018-00303, Exhibits 1025, 'ITC Investigation No. 337-TA-1023, Initial Determination (Excerpts),' filed Dec. 14, 2017.
Inter Partes Review of U.S. Pat. No. 9,535,623, Case No. IPR2018-00303, Exhibits 2008, 'The IEEE Standard Dictionary of Electrical and Electronic Terms, $6_{th}$ Edition,' filed Aug. 10, 2018.
Inter Partes Review of U.S. Pat. No. 9,535,623, Case No. IPR2018-00303, Exhibits 2009, 'The Authoritative Dictionary of IEEE Standard Terms, $7_{th}$ Edition,' filed Aug. 10, 2018.
Inter Partes Review of U.S. Pat. No. 9,535,623, Case No. IPR2018-00303, Exhibits 1030, 'Declaration of Brian Nester PHV,' filed Oct. 18, 2018.
Inter Partes Review of U.S. Pat. No. 9,535,623, Case No. IPR2018-00303, Exhibits 1032, 'Annotated p. 37 of Ex. 2005,' filed Nov. 9, 2018.
Inter Partes Review of U.S. Pat. No. 9,535,623, Case No. IPR2018-00303, Exhibits 1034, 'ITC Expert Report of Robert Mr. Murphy Regarding 623 Patent (Public Version),' filed Nov. 9, 2018.
Inter Partes Review of U.S. Pat. No. 9,535,623, Case No. IPR2018-00303, Exhibits 1033, 'Annotated p. 18 of Ex. 2005,' filed Nov. 9, 2018.
Inter Partes Review of U.S. Pat. No. 9,535,623, Case No. IPR2018-00303, Exhibits 1035, 'Mr. Murphy 623 IPR Deposition Transcript (Oct. 25, 2018),' filed Nov. 9, 2018.
Inter Partes Review of U.S. Pat. No. 9,535,623, Case No. IPR2018-00303, Exhibits 1036, 'Mr. Murphy 623 ITC Deposition Transcript (Oct. 19, 2018),' filed Nov. 9, 2018.
Inter Partes Review of U.S. Pat. No. 9,535,623, Case No. IPR2018-00303, Exhibits 1037, 'JEDEC Standard (JESD79-3),' filed Nov. 9, 2018.
Inter Partes Review of U.S. Pat. No. 9,535,623, Case No. IPR2018-00303, Final Written Decision, issued Mar. 21, 2019.
Inter Partes Review No. 2020-01042 of U.S. Pat. No. 10,474,595, 'Petition for Inter Partes Review,' filed Jun. 9, 2020.
Inter Partes Review No. 2020-01042 of U.S. Pat. No. 10,474,595, Exhibits 1003, 'Declaration of Donald Alpert,' filed Jun. 9, 2020.
Inter Partes Review No. 2020-01044 of U.S. Pat. No. 9,858,218, 'Petition for Inter Partes Review,' filed Jun. 9, 2020.
Inter Partes Review No. 2020-01044 of U.S. Pat. No. 9,858,218, Exhibits 1003, 'Declaration of Donald Alpert,' filed Jun. 9, 2020.
Inter Partes Review No. 2020-01042 of U.S. Pat. No. 10,474,595, Case No. IPR2020-01042, Exhibits 1050, 'Declaration of Julie Carlson,' filed Jun. 9, 2020.
Inter Partes Review No. 2020-01042 of U.S. Pat. No. 10,474,595, Case No. IPR2020-01042, Exhibits 1054, 'Declaration of John Halbert,' filed Jun. 9, 2020.
Inter Partes Review No. 2020-01042 of U.S. Pat. No. 10,474,595, Case No. IPR2020-01042, Exhibits 1055, 'Declaration of Roland Knaack,' filed Jun. 9, 2020.
Inter Partes Review of U.S. Pat. No. 10,474,595, Case No. IPR2020-01042, Patent Owner's Preliminary Response, filed Sep. 18, 2020.
Inter Partes Review of U.S. Pat. No. 10,474,595, Case No. IPR2020-01042, Petitioners' Reply to Patent Owner's Preliminary Response, filed Oct. 8, 2020.
Inter Partes Review of U.S. Pat. No. 10,474,595, Case No. IPR2020-01042, Patent Owner's Sur-Reply to Petitioner's Reply to Patent Owner's Preliminary Response, filed Oct. 15, 2020.
Inter Partes Review of U.S. Pat. No. 9,858,218, Case No. IPR2020-01044, Patent Owner's Preliminary Response, filed Sep. 18, 2020.

(56)        References Cited

OTHER PUBLICATIONS

Inter Partes Review of U.S. Pat. No. 9,858,218, Case No. IPR2020-01044, Petitioners' Reply to Patent's Owner Preliminary Response, filed Oct. 8, 2020.

Inter Partes Review of U.S. Pat. No. 9,858,218, Case No. IPR2020-01044, Patent Owner's Sur-Reply to Petitioner's Reply to Patent Owner's Preliminary Response, filed Oct. 15, 2020.

Inter Partes Review of U.S. Pat. No. 10,474,595, Case No. IPR2020-01042, Decision Granting Institution of Inter Partes Review, issued Dec. 17, 2020, 47 pgs.

Inter Partes Review of U.S. Pat. No. 9,858,218, Case No. IPR2020-01044, Decision Granting Institution of Inter Partes Review, issued Dec. 17, 2020, 55 pgs.

Inter Partes Review of U.S. Pat. No. 10,474,595, Case No. IPR2020-01042, Exhibit 1069, 'Netlist, Inc. Complaint for Patent Infringement, *Netlist, Inc.* v. *SK hynix Inc et al*, 6:20-cv-00194 (Mar. 17, 2020),' filed Oct. 8, 2020.

Inter Partes Review of U.S. Pat. No. 10,474,595, Case No. IPR2020-01042, Exhibit 2005, 'Claim Construction Order, *STC.UNM* v. *Apple Inc.*, Civil No. 1:20-cv-00351-ADA (W.D. Tex. Jun. 8, 2020),' filed Sep. 18, 2020.

Inter Partes Review of U.S. Pat. No. 10,474,595, Case No. IPR2020-01042, Exhibit 2006, 'Claim Construction Order, *Uniloc 2017 LLC* v. *Apple Inc.*, Civil No. 6:19-cv-00532-ADA (W.D. Tex. Jun. 8, 2020),' filed Sep. 18, 2020.

Inter Partes Review of U.S. Pat. No. 10,474,595, Case No. IPR2020-01042, Exhibit 2007, 'Claim Construction Order, *MV3 Partners LLC* v. *Roku Inc.*, Civil No. 6:18-cv-00308-ADA (W.D.Tex. Oct. 19, 2019),' filed Sep. 18, 2020.

Inter Partes Review of U.S. Pat. No. 10,474,595, Case No. IPR2020-01042, Exhibit 2009, 'Exhibit A1 of SK hynix's Invalidity Contentions, dated Aug. 7, 2020,' filed Sep. 18, 2020.

Inter Partes Review of U.S. Pat. No. 10,474,595, Case No. IPR2020-01042, Exhibit 2010, 'Exhibit A21 of SK hynix's Invalidity Contentions, dated Aug. 7, 2020,' filed Sep. 18, 2020.

Inter Partes Review of U.S. Pat. No. 10,474,595, Case No. IPR2020-01042, Exhibit 2011, 'Exhibit A19 of SK hynix's Invalidity Contentions, dated Aug. 7, 2020,' filed Sep. 18, 2020.

Inter Partes Review of U.S. Pat. No. 10,474,595, Case No. IPR2020-01042, Exhibit 2012, 'Exhibit A36 of SK hynix's Invalidity Contentions, dated Aug. 7, 2020,' filed Sep. 18, 2020.

Inter Partes Review of U.S. Pat. No. 10,474,595, Case No. IPR2020-01042, Exhibit 2013, 'SK hynix's Invalidity Contentions, dated Aug. 7, 2020,' filed Sep. 18, 2020.

Inter Partes Review of U.S. Pat. No. 10,474,595, Case No. IPR2020-01042, Exhibit 2026, "Remote Deposition Under Oral Examination of Dr. Donald Alpert, Mar. 10, 2021," filed Mar. 11, 2021, 493 pgs.

Inter Partes Review of U.S. Pat. No. 10,474,595, Case No. IPR2020-01042, Exhibit 2027, "DDR3 SDRAM LRDIMM," filed Mar. 11, 2021, 18 pgs.

Inter Partes Review of U.S. Pat. No. 10,474,595, Case No. IPR2020-01042, Exhibit 2028, "Join JEDEC Membership Details," filed Mar. 11, 2021, 2 pgs.

Inter Partes Review of U.S. Pat. No. 10,474,595, Case No. IPR2020-01042, Exhibit 2029, "DRAM Circuit Design: Fundamental and High-Speed Topics," filed Mar. 11, 2021, 4 pgs.

Inter Partes Review of U.S. Pat. No. 10,474,595, Case No. IPR2020-01042, Exhibit 2030, "Semiconductor Memories: A Handbook and Design, Manufacture, and Application Second Edition," filed Mar. 11, 2021, 6 pgs.

Inter Partes Review of U.S. Pat. No. 10,474,595, Case No. IPR2020-01042, Exhibit 2031, "Deposition of Donald Alpert, Ph.D.," filed Mar. 11, 2021, 218 pgs.

Inter Partes Review of U.S. Pat. No. 10,474,595, Case No. IPR2020-01042, Exhibit 2032, "Declaration of Robert J. Murphy," filed Mar. 11, 2021, 65 pgs.

Inter Partes Review of U.S. Pat. No. 10,474,595, Case No. IPR2020-01042, "Patent Owner's Response Under 37 C.F.R. Section 42.120," Mar. 11, 2021, 68 pgs.

Inter Partes Review of U.S. Pat. No. 10,474,595, Case No. IPR2020-01042, Exhibit 2024, "Declaration of Matthew S. Galica," filed Mar. 8, 2021, 4 pgs.

Inter Partes Review of U.S. Pat. No. 10,474,595, Case No. IPR2020-01042, Exhibit 2025, "Declaration of Andrew H. De Voogd," filed Mar. 8, 2021, 4 pgs.

Inter Partes Review of U.S. Pat. No. 10,474,595, Case No. IPR2020-01042, "Patent Owner's Request for Rehearing of Institution Decision," Mar. 30, 2021, 12 pgs.

Inter Partes Review of U.S. Pat. No. 9,858,218, Case No. IPR2020-01044, Exhibit 2032, "Declaration of Robert J. Murphy," filed Mar. 12, 2021, 63 pgs.

Inter Partes Review No. 2022-00062 of U.S. Pat. No. 9,858,218, Exhibits 1067, *Samsung Electronics Co. LTD., et al.* v. *Netlist Inc.*, in the United States District Court for the District of Delaware, 'Complaint for Declaratory Judgment of Non-Infringement and Unenforceability; Breach of Contract,' filed Oct. 15, 2021.

Inter Partes Review No. 2022-00062 of U.S. Pat. No. 9,858,218, Exhibits 1061, *Netlist, Inc.* vs. *SK Hynix Inc., et al.*, in the United States District Court for the Western District of Texas Waco Division, 'Claim Construction Order,' issued Mar. 12, 2021, filed Oct. 15, 2021.

Inter Partes Review No. 2022-00062 of U.S. Pat. No. 9,858,218, Exhibits 1055, 'Declaration of Sung Joo Park,' filed Oct. 15, 2021.

Inter Partes Review No. 2022-00062 of U.S. Pat. No. 9,858,218, Exhibits 1003, 'Declaration of Donald Alpert,' filed Oct. 15, 2021.

Inter Partes Review No. 2022-00062 of U.S. Pat. No. 9,858,218, 'Petition for Inter Partes Review of U.S. Pat. No. 9,858,218,' Oct. 15, 2021.

Inter Partes Review No. 2022-00064 of U.S. Pat. No. 10,474,595, Exhibits 1003, 'Declaration of Donald Alpert,' filed Oct. 15, 2021.

Inter Partes Review No. 2022-00064 of U.S. Pat. No. 10,474,595, Paper 1, 'Petition for Inter Partes Review of U.S. Pat. No. 10,474,595,' Oct. 15, 2021.

JEDEC Committee Letter Ballot, LRDIMM DDR3 Memory Initialization Chapter Proposal (Dec. 2009) ("JEDEC") Inphi Corporation, MB Initialization sequence Item 142.35, Jun. 4, 2009.

JEDEC Standard, FBDIMM Advanced Memory Buffer (AMB) (Mar. 2007) ("JESD82-20A").

JEDEC Standard, Low Power Double Data Rate (LPDDR) SDRAM Specification (Aug. 2007) ("JESD209").

JEDEC Committee Letter Ballot, DDR3 LRDIMM Design Specification Body (Dec. 2009).

JEDEC, Compilation of Tallies for JC-40 CMOS Digital Logic and point committees (Dec. 4, 2009).

"Sequence," https://www.lexico.com/en/definition/sequence "28-Bit to 56-Bit Registered Buffer with Address Parity Test One Pair to Four Pair Differential Clock PLL Driver," Texas Instruments (Oct. 2008).

"High-Speed DRAM Controller Design" Micron (2008).

"Minutes of Meeting No. 158 JC-40 Digital Logic Committee" JEDEC (Jun. 4, 2009).

JEDEC Stanard, DDR3 SDRAM, JESD79-3C (Nov. 2008) ("JESD79-3C").

JEDEC Manual of Organization and Procedure, JM21P (Rev. of JM21N, May 2008), (May 2010).

JEDEC, JEDEC Manual of Organization and Procedure, JM2IN (Rev. of JM21M, Dec. 2006), (May 2008).

JEDEC, "Committee Letter Ballot, JC-40.4-09-320, Item 142.35," (Dec. 2009).

JEDEC, "Committee Letter Ballot, JC-45.4-09-321, Item 2192.44," (Dec. 2009).

JEDEC, "Tally of Votes, Committee Letter Ballot, JC-45.4-09-321, 2192.44" (Dec. 9, 2009).

JEDEC Standard, FBDIMM: Architecture and Protocol (Jan. 2007) ("JESD206").

Lee, Office Action, U.S. Appl. No. 15/088,115, May 20, 2016, 10 pgs.

Lee, Office Action, U.S. Appl. No. 15/088,115, Jun. 16, 2017, 9 pgs.

Lee, Notice of Allowance, U.S. Appl. No. 15/088,115, Oct. 12, 2017, 5 pgs.

Lee, Office Action, U.S. Appl. No. 13/942,721, May 22, 2015, 6 pgs.

(56)        References Cited

OTHER PUBLICATIONS

Lee, Final Office Action, U.S. Appl. No. 13/942,721, Nov. 16, 2015, 6 pgs.
Lee, Notice of Allowance, U.S. Appl. No. 13/942,721, Feb. 24, 2016, 5 pgs.
Lee, Office Action, U.S. Appl. No. 12/815,339, Sep. 14, 2012, 14 pgs.
Lee, Notice of Allowance, U.S. Appl. No. 12/815,339, Mar. 20, 2013, 6 pgs.
Lee, Notice of Allowance, U.S. Appl. No. 15/857,553, Feb. 6, 2019, 5 pgs.
Inter Partes Review of U.S. Pat. No. 9,858,218, Case No. IPR2022-00062, Exhibit 1067—Oct. 15, 2021 Complaint, filed Oct. 15, 2021.
Inter Partes Review of U.S. Pat. No. 9,858,218, Case No. IPR2022-00062, Exhibit 1061—WDTX Claim Construction, filed Oct. 15, 2021.
Inter Partes Review of U.S. Pat. No. 9,858,218, Case No. IPR2022-00062, Exhibit 2019—Redline comparison of 2022IPR-00062 to IPR2020-01044, filed Feb. 18, 2022.
Inter Partes Review of U.S. Pat. No. 9,858,218, Case No. IPR2022-00062, Exhibit 2017—Microway, DDR4 RDIMM and LRDIMM Performance Comparison (Jul. 10, 2015), https://www.microway.com/hpctech-tips/ddr4-rdimm-lrdimm-performance-comparison/, filed Feb. 18, 2022.
Inter Partes Review of U.S. Pat. No. 9,858,218, Case No. IPR2022-00062, Exhibit 2016—Intel, Fully Buffered DIMM (FB-DIMM) Design Considerations (Feb. 18, 2004), http://www.csit-sun.pub.ro/~cpop/Documentatie_SMP/Intel_Microprocessor_Systems/PC_Memory/OSA-S009.pdf, filed Feb. 18, 2022.
Inter Partes Review of U.S. Pat. No. 9,858,218, Case No. IPR2022-00062, Exhibit 2012—Excerpt of Semiconductor Memories, A Handbook of Design, Manufacture, and Application Second Edition (1997), filed Feb. 18, 2022.
Inter Partes Review of U.S. Pat. No. 9,858,218, Case No. IPR2022-00062, Exhibit 2011—Excerpt of DRAM Circuit Design, Fundamental and High Speed Topics (2008), filed Feb. 18, 2022.
Inter Partes Review of U.S. Pat. No. 9,858,218, Case No. IPR2022-00062, Exhibit 2006—IT Solution Architects, Server Memory: RDIMM vs LRDIMM and When to Use Them (Aug. 16, 2017), https://medium.com/@ITsolutions/server-memory-rdimm-vslrdimm-and-when-to- use-them-a550f4b7cf39, filed Feb. 18, 2022.
Inter Partes Review of U.S. Pat. No. 9,858,218, Case No. IPR2022-00062, Exhibit 2001—Declaration of Robert J. Murphy, dated Feb. 18, 2022 (corrected), filed Feb. 18, 2022.
Inter Partes Review of U.S. Pat. No. 9,858,218, Case No. IPR2022-00062, Netlist, Inc.s Patent Owners Preliminary Response, filed Feb. 18, 2022.
Inter Partes Review of U.S. Pat. No. 10,474,595, Case No. IPR2022-00064, Netlist, Inc.s Patent Owners Preliminary Response, filed Feb. 18, 2022.
Inter Partes Review of U.S. Pat. No. 10,474,595, Case No. IPR2022-00064, Exhibit 2001—Declaration of Robert J. Murphy, dated Feb. 18, 2022 (corrected), filed Feb. 18, 2022.
Inter Partes Review of U.S. Pat. No. 9,858,218, Case No. IPR2022-00062, Exhibit 1069—Netlist's motion to dismiss in Delaware, filed Mar. 18, 2022.
Inter Partes Review of U.S. Pat. No. 9,858,218, Case No. IPR2022-00062, Exhibit 1068—Samsung's first amended complaint, filed Mar. 18, 2022.
Inter Partes Review of U.S. Pat. No. 9,858,218, Case No. IPR2022-00062, Petitioner's Authorized Reply to Patent Owner's Preliminary Response, filed Mar. 18, 2022.
Inter Partes Review of U.S. Pat. No. 10,474,595, Case No. IPR2022-00064, Petitioner's Authorized Reply to Patent Owner's Preliminary Response, filed Mar. 18, 2022.
Inter Partes Review of U.S. Pat. No. 9,858,218, Case No. IPR2022-00062, Patent Owners Authorized Sur-Reply in Support of Its Preliminary Response, filed Mar. 25, 2022.

Inter Partes Review of U.S. Pat. No. 10,474,595, Case No. IPR2022-00064, Patent Owners Authorized Sur-Reply in Support of Its Preliminary Response, filed Mar. 25, 2022.
Inter Partes Review of U.S. Pat. No. 9,858,218, Case No. IPR2022-00062, Institution Decision: Grant, issued May 16, 2022.
Inter Partes Review of U.S. Pat. No. 10,474,595, Case No. IPR2022-00064, Institution Decision: Grant, issued May 16, 2022.
Inter Partes Review of U.S. Pat. No. 9,858,218, Case No. IPR2022-00062, Exhibit 2028—AMD Geode LX Processor DDR2 BIOS Porting Guide (Mar. 2009), filed Aug. 15, 2022.
Inter Partes Review of U.S. Pat. No. 9,858,218, Case No. IPR2022-00062, Exhibit 2027—Second Declaration of Dr. Robert Murphy, dated Aug. 15, 2022, filed Aug. 15, 2022.
Inter Partes Review of U.S. Pat. No. 9,858,218, Case No. IPR2022-00062, Netlist, Inc.s Patent Owners Response, filed Aug. 15, 2022.
Inter Partes Review of U.S. Pat. No. 10,474,595, Case No. IPR2022-00064, Netlist, Inc.s Patent Owners Response, filed Aug. 15, 2022.
Inter Partes Review of U.S. Pat. No. 10,474,595, Case No. IPR2022-00064, Exhibit 2027—Second Declaration of Dr. Robert Murphy, dated Aug. 15, 2022, filed Aug. 15, 2022.
Inter Partes Review of U.S. Pat. No. 9,858,218, Case No. IPR2022-00062, Exhibit 1081—Annotation of DDR3 LRDIMM, filed Nov. 7, 2022.
Inter Partes Review of U.S. Pat. No. 9,858,218, Case No. IPR2022-00062, Exhibit 1080—Annotation of DDR3 LRDIMM, filed Nov. 7, 2022.
Inter Partes Review of U.S. Pat. No. 9,858,218, Case No. IPR2022-00062, Exhibit 1079—Netlist's Technology Tutorial, filed Nov. 7, 2022.
Inter Partes Review of U.S. Pat. No. 9,858,218, Case No. IPR2022-00062, Exhibit 1078—Redline comparing Murphy declarations for 218 and 595 patents, filed Nov. 7, 2022.
Inter Partes Review of U.S. Pat. No. 9,858,218, Case No. IPR2022-00062, Exhibit 1077—Deposition of Robert Murphy (Oct. 27, 2022), filed Nov. 7, 2022.
Inter Partes Review of U.S. Pat. No. 9,858,218, Case No. IPR2022-00062, Petitioner's Reply to Patent Owner's Response, filed Nov. 7, 2022.
Inter Partes Review of U.S. Pat. No. 10,474,595, Case No. IPR2022-00064, Petitioner's Reply to Patent Owner's Response, filed Nov. 7, 2022.
Inter Partes Review of U.S. Pat. No. 9,858,218, Case No. IPR2022-00062, Netlist, Inc.'s Patent Owner's Sur-Reply, filed Dec. 19, 2022.
Inter Partes Review of U.S. Pat. No. 10,474,595, Case No. IPR2022-00064, Netlist, Inc.'s Patent Owner's Sur-Reply, filed Dec. 19, 2022.
Inter Partes Review of U.S. Pat. No. 9,858,218, Case No. IPR2022-00062, Exhibit 2029—Patent Owner's Oral Hearing Demonstratives, filed Feb. 9, 2023.
Inter Partes Review of U.S. Pat. No. 9,858,218, Case No. IPR2022-00062, Exhibit 1082—Petitioner's demonstratives for oral argument, filed Feb. 9, 2023.
Inter Partes Review of U.S. Pat. No. 9,858,218, Case No. IPR2022-00062, Other: Hearing transcript, filed Mar. 8, 2023.
Inter Partes Review of U.S. Pat. No. 9,858,218, Case No. IPR2022-00062, Final Written Decision, entered May 8, 2023.
Inter Partes Review of U.S. Pat. No. 10,474,595, Case No. IPR2022-00064, Final Written Decision, entered May 9, 2023.
Inter Partes Review Case No. IPR2025-00001, Petition for Inter Partes Review of U.S. Pat. No. 11,386,024, filed Oct. 8, 2024.
Inter Partes Review of U.S. Pat. No. 11,386,024, IPR Case No. IPR2025-00001, Exhibit 1003 "Declaration of Donald Alpert", filed Oct. 8, 2024.
Inter Partes Review of U.S. Pat. No. 11,386,024, IPR Case No. IPR2025-00001, Patent Owner's Preliminary Response, filed Feb. 20, 2025.
Inter Partes Review of U.S. Pat. No. 11,386,024, IPR Case No. IPR2025-00001, Petitioners' Reply to Patent's Owner Preliminary Response, filed Mar. 14, 2025.
Inter Partes Review of U.S. Pat. No. 11,386,024, IPR Case No. IPR2025-00001, Patent Owner's Sur-Reply to Petitioner's Reply to Patent Owner's Preliminary Response, filed Mar. 21, 2025.

(56) References Cited

OTHER PUBLICATIONS

Inter Partes Review of U.S. Pat. No. 11,386,024, IPR Case No. IPR2025-00001, Trial Instituted document, dated May 15, 2025.

Inter Partes Review Case No. IPR2025-00002, Petition for Inter Partes Review of U.S. Pat. No. 11,880,319, filed Oct. 8, 2024.

Inter Partes Review of U.S. Pat. No. 11,880,319, IPR Case No. IPR2025-00002, Exhibit 1003 "Declaration of Donald Alpert", filed Oct. 8, 2024.

Inter Partes Review of U.S. Pat. No. 11,880,319, IPR Case No. IPR2025-00002, Patent Owner's Preliminary Response, filed Feb. 21, 2025.

Inter Partes Review of U.S. Pat. No. 11,880,319, IPR Case No. IPR2025-00002, Petitioners' Reply To Patent's Owner Preliminary Response, filed Mar. 14, 2025.

Inter Partes Review of U.S. Pat. No. 11,880,319, IPR Case No. IPR2025-00002, Patent Owner's Sur-Reply to Petitioner's Reply to Patent Owner's Preliminary Response, filed Mar. 21, 2025.

Inter Partes Review of U.S. Pat. No. 11,880,319, IPR Case No. IPR2025-00002, Trial Instituted document, dated May 15, 2025.

Inter Partes Review of U.S. Pat. No. 11,880,319, IPR Case No. IPR2025-00002, Petitioner's Objections to Patent Owner's Evidence Submitted during the Preliminary Proceeding before Institution of Trial, dated May 30, 2025.

Inter Partes Review of U.S. Pat. No. 11,880,319, IPR Case No. IPR2025-00002, Patent Owner's Objections to Petitioner's Evidence Submitted during the Preliminary Proceeding before Institution of Trial, dated May 30, 2025.

Inter Partes Review of U.S. Pat. No. 11,880,319, IPR Case No. IPR2025-00002, Patent Owner's Request for Director Review of Decision Granting Institution, dated May 29, 2025.

Inter Partes Review of U.S. Pat. No. 11,880,319, IPR Case No. IPR2025-00002, Petitioner's Authorized Response to Patent Owner's Request for Director Review of Decision Granting Institution, dated Jun. 5, 2025.

JEDEC Standard, Terms, Definitions, and Letter Symbols for Microelectronic Devices, JESD99A.01 (Feb. 2000).

Inter Partes Review No. 2023-00455 of U.S. Pat. No. 9858215, IPR2023-201428 of U.S. Pat. No. 8,787,060, and IPR2023-00454 of U.S. Pat. No. 11,093,417, Ex. 1107—Deposition of Steven Przybylski (Feb. 15-16, 2024).

JEDEC Standard, Double Data Rate (Ddr) Sdram Specification, JESD79 (Jun. 2000).

JEDEC Standard, DDR2 Sdram Specification, JESD79-2B (Revision of JESD79-2A, Jan. 2005).

JEDEC Standard 21C, PC2100 and PC1600 DDR SDRAM Registered DIMM, Design Specification (Rev. 1.3, Jan. 2002).

Wang et al., U.S. Appl. No. 12/144,396, filed 23-Jun. 2008.

Definition of Sequence by Oxford Dictionary on Lexico.com, https://www.lexico.com/en/definition/sequence.

Texas Instruments, "28-Bit to 56-Bit Registered Buffer with Address Parity Test One Pair to Four Pair Differential Clock PLL Driver," (Oct. 2008).

* cited by examiner

200

MEMORY MODULE OPERABLE TO PROVIDE DISTINCT SIGNALING INTERFACES VIA AN OPEN-DRAIN OUTPUT FOR DISTINCT OPERATIONS

CROSS-REFERENCE TO RELATED APPLICATIONS

This application is a continuation of U.S. application Ser. No. 17/840,593, filed Jun. 14, 2022, which is a continuation of U.S. application Ser. No. 16/680,060, filed Nov. 11, 2019, which is a continuation of U.S. application Ser. No. 15/857, 553, filed Dec. 28, 2017, now U.S. Pat. No. 10,474,595, which is a continuation of U.S. application Ser. No. 15/088, 155, filed Apr. 1, 2016, now U.S. Pat. No. 9,858,218, which is a continuation of U.S. application Ser. No. 13/942,721, filed Jul. 16, 2013, now U.S. Pat. No. 9,311,116, which is a continuation of U.S. application Ser. No. 12/815,339, filed Jun. 14, 2010, now U.S. Pat. No. 8,489,837, which claims the benefit of priority from U.S. Provisional App. No. 61/186,799, filed Jun. 12, 2009, each of which is incorporated in its entirety by reference herein.

FIELD OF THE DISCLOSURE

The present disclosure relates to the operation of memory modules. Specifically, the present disclosure relates to a memory subsystem providing distinct signaling interfaces via an open-drain output for distinct operations.

BACKGROUND OF THE DISCLOSURE

Memory subsystems such as memory modules are generally involved in the initialization procedure for computer systems, including servers, personal computers, and the like. For example, during system-wide initialization, the memory subsystems may undergo internal initialization procedures, or the system memory controller may otherwise interact with the memory subsystems during the initialization procedure. As part of this interaction, the system memory controller may request that the memory subsystem perform one or more requested tasks during system initialization.

SUMMARY

According to certain aspects, a memory subsystem is operable with a memory controller of a host computer system. The memory subsystem includes dynamic random access memory elements on a printed circuit board and configurable to communicate data signals with the system memory controller. The memory subsystem further includes a memory subsystem controller on the printed circuit board and coupled to the dynamic random access memory elements. The memory subsystem controller has an open drain output and is configured to provide a first signaling interface via the open drain output during normal operations and a second signaling interface via the open drain output during an initialization operation including initialization operation sequences. The second signaling interface is distinct from the first signaling interface, and the initialization operation is distinct from any of the normal operations. The memory subsystem controller is configured to use the first signaling interface to indicate a parity error in response to a parity error having occurred during the normal operations. The memory subsystem controller is further configured use the second signaling interface to output a signal related to one or more parts of the initialization operation sequences during the initialization operation.

According to certain aspects, the memory subsystem controller includes a transistor having an open drain coupled to the open drain output, a source coupled to ground, and a gate. The memory subsystem controller is configurable to apply a first signal to the gate of the transistor to indicate a parity error having occurred during the normal operations, and to apply a second signal related to the one or more parts of the initialization operation sequences to the gate of the transistor during the initialization operation. The memory subsystem controller further includes a logic circuit having an output coupled to the gate of the transistor, a first input to receive the first signal, and a second input to receive the second signal. The memory subsystem controller is configurable to couple the first input to the output during the normal operations, and to couple the second input to the output during the initialization operation.

In another aspect, a method of operation at the memory subsystem coupled to the system memory controller in a host system comprises using the first signaling interface to indicate a parity error via the open drain output in response to a parity error having occurred during normal operations, and using the second signaling interface to output via the open drain output a signal related to one or more parts of the initialization operation sequences during an initialization operation.

DETAILED DESCRIPTION

Figures 1, 2, 3:
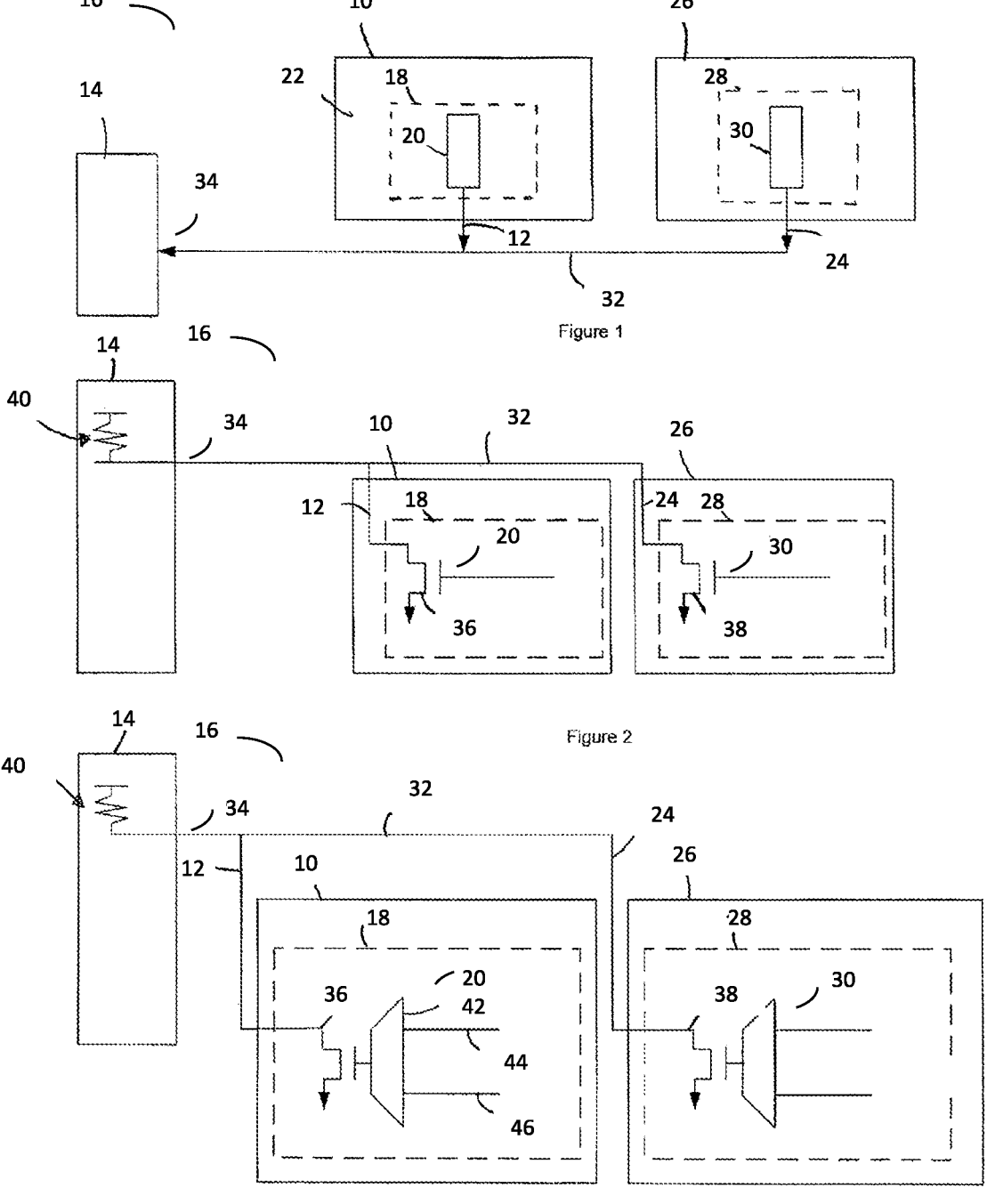
FIG. 1 shows an example host computer system including an example memory module configured to perform handshaking with a memory controller of the host computer system according to certain embodiments described herein.
FIG. 2 shows an example host computer system including example first and second memory modules configured to perform handshaking with a system memory controller of the host computer system according to certain embodiments described herein.
FIG. 3 shows a host computer system including example first and second memory modules configured to perform handshaking with a memory controller of the host system, where the notification circuits of the first and second memory modules have another example configuration according to certain embodiments described herein.

Existing initialization schemes have certain inefficiencies which lead to wasted time and expense. Thus, there is a need to reduce the time and complexity involved in system memory controller interactions with memory subsystems during initialization. Certain embodiments described herein advantageously satisfy at least a portion of this need by providing a system and method which utilizes a feedback path from a memory subsystem such as a memory module to a system memory controller, such as a Memory Controller Hub (MCH) of a computer system during initialization.

In general, there is no existing method of handshaking between the MCH (e.g., system memory controller) and a memory subsystem (e.g., memory module) during initialization. For example, in conventional systems, the system memory controller does not monitor the error-out signal from the memory subsystem. This causes the MCH to perform blind execution. In a typical server (e.g., an Intel or AMD or other chipset based server), the lack of any hand-shaking between the MCH and the memory subsystem during the server initialization period has not been a serious issue since the MCH generally has complete control over the initialization procedure. However, one possible configura-tion for LR-DIMM (Load Reduced DIMM) includes the MCH handing over one or more parts of the initialization operation sequence to the memory subsystem. This raises an unprecedented issue not addressed in conventional systems because, in such proposed configurations, the system can benefit from the MCH handshaking with the memory sub-system controller, as described more fully below.

Such an LR-DIMM configuration may have the MCH inserting a waiting period of predetermined length during which the MCH is idle and the memory subsystem controller undergoes initialization. However, one shortcoming of this LR-DIMM configuration would be that it requires the MCH to be in standby (idle, or wait) while the memory subsystem controller completes its task. Under such an arrangement, since the time to complete a task can be dependent on the density, speed and configuration of the memory subsystem, and these parameters may be unknown to the MCH, the MCH may have to insert a single, predetermined standby period. In addition, if there are multiple occasions that the MCH needs to hand off control to the memory subsystem controller, the required MCH wait periods can be different from one occasion to another, and it complicates the corre-lation between the MCH and the memory subsystem con-troller. For example, the MCH according to such a scheme may give control to the local memory controller of a memory subsystem (e.g., memory module) for execution of a training sequence. The MCH may wait for a pre-deter-mined period of time and then assume that the local memory controller has completed the training sequence. However, depending on the memory subsystem parameters (e.g., memory capacity, speed, number of ranks, etc.), the time for actually completing the training sequence may vary and may be longer or shorter than predetermined period of time.

In general, handshaking can be implemented in at least two ways; polling and notifying. In the polling method, the MCH reads a status register in the memory subsystem controller to find out if the memory subsystem controller has completed the required or requested operation. For example, a status register may be read out through a serial interface such as System Management Bus (SMBus). However, a register polling method is generally inefficient because the system memory controller does not know exactly when the memory subsystem will have completed the required or requested operation. Thus, the system memory controller may wait longer than necessary to poll the memory subsys-tem, thereby delaying the overall initialization process. Additionally, the problem may be compounded because multiple training sequences or other initialization sequences may be run on the memory subsystem during a particular initialization period, resulting in accumulation of such unnecessary delays. Moreover, polling generally involves scheduling polling intervals during which the system memory controller is not performing other operations, resulting in further inefficiency.

Alternatively, the notifying method is an advantageous handshaking method between the MCH and the memory subsystem controller. According to a notifying method, the memory subsystem controller sends a signal to the MCH when the memory subsystem controller completes the required or requested operation. This method allows the MCH to execute one or more independent commands while it is waiting for a notification signal from the memory subsystem controller.

Certain embodiments described herein provide a method of establishing a handshake mechanism based on notifica-tion signaling. In certain embodiments, this mechanism can be implemented by adding a new interface (notifying) signal between the MCH and the memory subsystem controller, or by adding an additional functionality to an existing, non-timing critical signal without altering the memory subsystem hardware. In either case, the interface between the MCH and the memory subsystem controller of certain embodiments can be an open drain signaling from the memory subsystem controller to the MCH, although a variety of other configu-rations are possible. As will be appreciated by persons skilled in the art, the terms MCH, system memory controller, and memory subsystem are used generally interchangeable throughout this disclosure, and the terms memory module, memory subsystem controller, and local memory controller are used generally interchangeably throughout this disclo-sure.

FIG. 1 illustrates an example host computer system 16 including an example memory module 10 according to certain embodiments described herein. The memory module 10 can comprise at least one output 12 configured to be operatively coupled to a system memory controller 14 of the host computer system 16. In certain embodiments, the memory module 10 is configured to operate in at least two modes comprising an initialization mode during which the memory module 10 executes at least one initialization sequence, and an operational mode. The memory module 10 may further include a controller circuit 18. In some embodi-ments, the controller circuit 18 is configured to cause the memory module 10 to enter the initialization mode. The memory module 10 can further include a notification circuit 20 configured to drive the at least one output 12 while the memory module 10 is in the initialization mode to provide at least one notification signal to the memory controller 14 indicating at least one status of the at least one initialization sequence.

The memory module 10 may comprise a printed-circuit board (PCB) 22. In certain embodiments, the memory module 10 has a memory capacity of 512-MB, 1-GB, 2-GB, 4-GB, 8-GB, 16-GB, or higher. Other memory capacities are also compatible with certain embodiments described herein. In addition, memory modules 10 having widths of 4 bytes, 8 bytes, 16 bytes, 32 bytes, or 32 bits, 64 bits, 128 bits, 256 bits, as well as other widths (in bytes or in bits), are compatible with embodiments described herein. The PCB 22 can have an industry-standard form factor. For example, the PCB 22 can have a low profile (LP) form factor with a height of 30 millimeters and a width of 133.35 millimeters. In certain other embodiments, the PCB 20 has a very high profile (VHP) form factor with a height of 50 millimeters or more. In certain other embodiments, the PCB 22 has a very low profile (VLP) form factor with a height of 18.3 milli-meters. Other form factors including, but not limited to, small-outline (SO-DIMM), unbuffered (UDIMM), regis-tered (RDIMM), fully-buffered (FBDIMM), mini-DIMM, mini-RDIMM, VLP mini-DIMM, micro-DIMM, and SRAM DIMM are also compatible with certain embodi-ments described herein. In other embodiments, certain non-DIMM form factors are possible such as, for example, single in-line memory module (SIMM), multi-media card (MMC), and small computer system interface (SCSI).

In certain embodiments, the memory module 10 is opera-tively coupled to (e.g., in electrical communication with) the host computer system 16. In certain other embodiments, the memory module 10 may communicate with the host computer system 16 using some other type of communication, such as, for example, optical communication. Examples of host computer systems 16 include, but are not limited to, blade servers, 1U servers, personal computers (PCs), and other applications in which space is constrained or limited. The PCB 22 can comprise an interface (not shown) that is configured to be in electrical communication with the host computer system 16. For example, the interface can comprise a plurality of edge connections which fit into a corresponding slot connector of the host system 16. The interface of certain embodiments provides a conduit for power voltage as well as data, address, and control signals between the memory module 10 and the host system 16. For example, the interface can comprise a standard 240-pin DDR2 edge connector. The at least one output 12 may be routed over the interface, for example.

The memory module 10 may also comprise one or more memory elements (not shown), such as dynamic random-access memory (DRAM) elements, for example. Types of DRAM elements compatible with certain embodiments described herein include, but are not limited to, DDR, DDR2, DDR3, DDR4, and synchronous DRAM (SDRAM). In addition, memory elements having bit widths of 4, 8, 16, 32, as well as other bit widths, are compatible with certain embodiments described herein. Memory elements compatible with certain embodiments described herein have packaging which include, but are not limited to, thin small-outline package (TSOP), ball-grid-array (BGA), fine-pitch BGA (FBGA), micro-BGA (μBGA), mini-BGA (mBGA), and chip-scale packaging (CSP). In certain embodiments, the memory module 10 may also include one or more non-volatile memory elements, such as one or more flash memory elements. Types of flash memory elements compatible with certain embodiments described herein include, but are not limited to, NOR flash, NAND flash, ONE-NAND flash, and multi-level cell (MLC).

The controller circuit 18 of certain embodiments generally controls the operation of the memory module 10. For example, the controller circuit 18 may control the memory elements of the memory module 10 and/or communicate with the system memory controller 14. For example, the controller circuit 18 may receive and process address and command signals (e.g., read, write commands) from the system memory controller 14 and transmit appropriate address and commands to the memory elements in response. See, e.g., U.S. Pat. Appl. Publ. Nos. 2006/0062047 A1 and 2006/0262586 A1, each of which is incorporated in its entirety by reference herein. In certain embodiments, the controller circuit 18 comprises a local memory controller. Additionally, depending on the architecture of the memory module 10, such as for an FB-DIMM, the controller circuit 18 may comprise an advanced memory buffer (AMB). The controller circuit 18 can comprise one or more of a field-programmable gate array (FPGA), a programmable-logic device (PLD), an application-specific integrated circuit (ASIC), a custom-designed semiconductor device, and a complex programmable logic device (CPLD), for example. In certain embodiments, the controller circuit 18 comprises various discrete electrical elements, while in certain other embodiments, the controller circuit 18 comprises one or more integrated circuits.

As discussed, the memory module 10 is configured to operate in at least two modes comprising an initialization mode during which the memory module 10 executes at least one initialization sequence, and an operational mode. In one embodiment, for example, the at least one initialization sequence may comprise one or more training sequences. The initialization sequence (e.g., comprising one or more training sequences) may be initiated by the system memory controller 14. In some embodiments, the controller circuit 18 is configured to cause the memory module 10 to enter the initialization mode. For example, the controller circuit 18 may be configured to execute a routine implementing the at least one initialization sequence when the appropriate signal or command is received from the memory controller 14 or is otherwise received from the host computer system 16 (e.g., upon receipt of a reset signal).

In certain embodiments, for example, the computer system 16 is coupled to a plurality of memory modules 10, 26 including the memory module 10 and at least a second memory module 26, and the memory controller 14 (e.g., MCH) trains each module 10, 26 separately, in series. In one example scenario, the memory controller 14 issues a first command to the memory module 10, and, in response, the memory module 10 executes an initialization sequence (e.g., one or more training sequences). Upon completion of the initialization sequence, the first memory module 10 advantageously issues a notification to the memory controller 14 in accordance with embodiments described herein. In response, the memory controller 14 issues a second command, this time to the memory module 26, and, in response, the memory module 26 executes an initialization sequence (e.g., one or more training sequences). Upon completion of the initialization sequence, the second memory module 26, similar to the first memory module 10, advantageously issues a notification to the memory controller 14 in accordance with embodiments described herein. In response, where there are more than two memory modules 10, 26, the memory controller 14 issues a third command to a third memory module (not shown), and so forth. One example computer system 16 capable of implementing such a scenario is configured to execute an Intel Basic Input/Output System (BIOS), and comprises a plurality of memory modules 10, 26 having an LRDIMM configuration. In such an example system, the Intel BIOS causes the system memory controller 14 to initialize the LRDIMM memory modules 10, 26 serially.

The operational mode is the normal mode of the memory module 10. For example, during the operational mode, the memory module 10 is generally accessed by the system memory controller 14 of the host computer 16 during standard computer operation not associated with initialization. For example, the system memory controller 14 may cause the memory module 10 to perform standard operations such as memory read/write, pre-charge, refresh, etc., while in operational mode, although it will be appreciated that one or more of these operations can also be performed by the memory module 10 while in initialization mode in certain embodiments.

The notification circuit 20 can be configured to drive the at least one output 12, while the memory module 10 is in the initialization mode or after the memory module 10 completes one or more initialization sequences, to provide the at least one notification signal to the memory controller 14 indicating at least one status of the at least one initialization sequence. While shown in FIGS. 1-3 as forming a part of the controller circuit 18, the notification circuit 20 may be a physically and/or logically separate circuit in certain embodiments. While a variety of configurations are possible, the notification circuit 20 may comprise one or more transistors, one or more logic elements (e.g., AND, OR, NOR, NAND, XOR gates, and the like), or a combination thereof.

In some embodiments, the notification circuit 20 may additionally or alternatively comprise one or more of an FPGA, PLD, CPLD, ASIC, custom-designed semiconductor device, discrete electrical elements, and an integrated circuit.

The at least one status of certain embodiments comprises completion of the at least one initialization sequence, such that the at least one notification signal is indicative of the completion of the at least one initialization sequence. The at least one status of certain embodiments comprises execution of the at least one initialization sequence. For example, the at least one status may indicate that the at least one initialization sequence is currently being executed. In some embodiments, the at least one status may provide an indication that a certain task has been completed by the memory module 10, such as a training task requested by the system memory controller 14. In certain embodiments, the notification circuit 20 can be configured to drive the at least one output 12 to a first state indicative of execution of the at least one initialization sequence or to a second state indicative of completion of the at least one initialization sequence. As one example, the first state may be a high or low logic level, and the second state may be a high impedance state. In another case, the first state is a high or low logic level, and the second state is the inverse logic level of the first state.

The at least one output 12 of certain embodiments is configured to be operatively coupled to at least one interrupt of the system memory controller 14, and the system memory controller 14 is responsive to the at least one notification signal indicating completion of the at least one initialization sequence. For example, the system memory controller 14 may trigger execution of an interrupt routine upon receipt of the notification signal on the output 12. The interrupt routine generally executes the appropriate operations for the at least one status indicated by the at least one notification signal. For example, if the at least one status indicates that the at least one initialization sequence is complete, execution of the interrupt routine may cause the system memory controller 14 to notify the host computer system 16 that the system initialization, or a portion thereof, is completed. In one embodiment, for example, the execution of the interrupt routine causes the system memory controller 14 to initiate a subsequent training sequence for the memory module 10 or on another memory module connected to the host system 16. For example, in one embodiment, a central processing unit (CPU) of the host system 16 (not shown) enters a "Wait" state after issuing a command to the memory module 10 to enter the initialization mode. Receipt of the at least one notification signal on the output 12 triggers execution of the interrupt routine, which interrupts the CPU, causing the "Wait" state to be aborted and allowing the host system 16 to continue operation. In this manner, generation of the interrupt on the at least one output 12 can allow completion of the at least one initialization sequence to receive generally immediate attention from the CPU and/or memory controller 14 of the host system 16. As will be appreciated, the CPU and memory controller 14 of the host system 16 may comprise separate modules, or may alternatively comprise a single integrated module, depending on the architecture of the host system 16 chip-set.

In certain embodiments, execution of the interrupt routine causes the system memory controller 14 to cause the memory module 10 to exit the initialization mode and to enter the operational mode. In another embodiment, the memory module 10 automatically enters the operational mode upon completion of the at least one initialization sequence without intervention from the memory controller 14.

In some embodiments, the at least one output 12 is operated in conformance with a standard (e.g., an industry standard) when the memory module 10 is in the operational mode, but is not operated in conformance with the standard when the memory module 10 is in the initialization mode. An example of a standard in accordance with certain embodiments described herein is one or more of the industry standard promulgated by the Joint Electronic Devices Engineering Counsel (JEDEC). For example, the operation and behavior of the at least one output 12 may conform to an industry standard when the memory module 10 is in the operational mode, but the operation and behavior of the at least one output 12 may not conform to the industry standard when the memory module 10 is in the initialization mode. Because the at least one output 12 does not conform to the standard during initialization mode, an existing (e.g., JEDEC-specified) pin may be utilized to provide the at least one notification signal to the system memory controller 14 from the memory module 10 during the initialization mode. In one embodiment, for example, the at least one output 12 comprises an error-out pin of the memory module 10. In conventional systems, the operation of the error-out pin is undefined by the standard during initialization. However, in certain embodiments described herein, during the operational mode, the error-out pin may be used according a conventional industry standard (e.g., a JEDEC standard) to indicate a parity error has occurred in the memory module 10. During the initialization mode, the error-out pin can be used to transmit the at least one notification signal to the system memory controller 14.

It is advantageous to use the error-out pin for initialization status notification according to certain embodiments because the error-out pin can be asserted by the memory module 10 independent from system memory controller 14 requests or commands. Also, because the error-out pin is a JEDEC-specified pin, design cost and complexity are reduced because additional pin-outs and interrupt design changes can be avoided (e.g., in cases where such changes in hardware or chipset may not be feasible to provide the at least one status to the system memory controller 14). However, in certain other embodiments, providing the at least one status may be implemented by adding one or more pins to the system memory controller 14 (e.g., MCH) and to the controller circuit 18 (e.g., local memory controller), thereby utilizing changes in hardware or the chipset.

Moreover, the error-out pin may be coupled to an interrupt of the system memory controller 14 (e.g., according to the JEDEC standard). Thus, where the error-out pin is used, from the system point of view in accordance with certain embodiments, the notification of completion of the required or requested task from the memory module 10 (e.g., by the local memory controller) generates an interrupt communicated to the system during the initialization period and indicative of completion of the required or requested task. Assertion of the same pin during normal (non-initialization) operation upon an error occurring, on the other hand, generates an interrupt communicated to the system during the normal operation indicative of the occurrence of the error condition. Thus, in certain embodiments, the error-out pin and corresponding signal memory module 10 can be used to support the notifying function and to provide the at least one status generally without changing hardware. Certain other such embodiments involve modifying the basic input/output system (BIOS) or other programming change. For example, the BIOS may be modified to indicate to the system memory controller 14 how to respond to the notification signal (e.g., to the error_out signal or the interrupt corresponding thereto).

In certain other embodiments, the at least one output 12 may include other existing (e.g., JEDEC specified) pins instead of, or in addition to, the error-out pin. In yet other configurations, at least one additional (e.g., non-JEDEC specified) pin may be employed. In general, any pin not otherwise active during the initialization mode may be used (e.g., high-order address pins, read/write pins, data pins, etc.).

The at least one output 12 can further be configured to be operatively coupled to at least one second output 24 of a second memory module 26 in some embodiments, as schematically illustrated in FIGS. 1-3. The second memory module 26 may be generally similar in structure and function to the memory module 10, and may comprise a controller circuit 28 and a notification circuit 30, for example. The second memory module 26 may be generally identical to the first memory module 10, or may have a different memory capacity, form factor, etc., than the first memory module 10. More than two such memory modules may be present in certain embodiments. As described above, the second memory module 26 can be configured to operate in at least two modes comprising an initialization mode during which the second memory module 26 executes at least one initialization sequence, and an operational mode. For example, the initialization and operational modes may be similar to those describe above in relation to the first memory module 10.

The second memory module 26 can also be configured to drive the at least one second output 24 to a third state indicative of execution of at least one initialization sequence of the second memory module 26 or to a fourth state indicative of completion of the at least one initialization sequence of the second memory module 26. Additionally, in some embodiments, the at least one first output 12 of the first memory module 10 and the at least one second output 24 of the second memory module 26 are operatively coupled together by a bus 32 which is also operatively coupled to at least one input 34 of the system memory controller 14. In other embodiments (not shown), the at least one first output 12 and the at least one second output 24 are not coupled together, and are coupled to two separate inputs of the system memory controller 14.

FIG. 2 shows an example host computer system 16 including example first and second memory modules 10, 26. As shown, the notification circuits 20, 30 of the first and second memory modules 10, 26 each comprise at least one transistor 36, 38. The at least one transistor 36, 38 can be in an open-drain configuration, as shown, although other configurations are possible. In certain such embodiments, the first state of the at least one first output 12 is a first logic level, the second state of the at least one first output 12 is a high-impedance state, the third state of the at least one second output 24 is the first logic level, and the fourth state of the at least one second output 24 is the high-impedance state. In the illustrated example, while the at least one initialization sequence is in progress, the first and second memory modules 10, 26 drive the gates of the respective transistors 36, 38 high. Thus, the transistors 36, 38 are respectively low impedance while the memory modules 10, 26 are executing each section of the initialization sequence, thereby pulling the first and second outputs 12, 24 low. Thus, the first state and the third state are low logic levels (ground) in the example configuration. Also, because the first and second outputs 12, 24 are coupled together by the bus 32, if the at least one initialization sequence of either one of the first and second memory modules 10, 26 are in progress, the bus 32 will be pulled to a low logic level.

As each of the two memory modules 10, 26 completes its at least one initialization sequence, it can drive the corresponding at least one first and second outputs 12, 24 respectively to a high impedance state, For example, once the at least one initialization sequence on each of the first and second memory modules 10, 26 is completed, the first and second memory modules 10, 26 can drive the gates of the respective transistors 36, 38 low, resulting in a high-impedance state on the at least one first and second outputs 12, 24 causing the bus 32 to be pulled high by the system memory controller 14. Accordingly, only once the at least one initialization sequence of both the first and second memory modules 10, 26 are complete, the bus 32 will be pulled high by the internal pull-up configuration 40 of the system memory controller 14. The second state and the fourth state are therefore high-impedance values in the example embodiment. Thus, the system memory controller 14 can monitor the value on the bus 32 via the first input 34 to determine when both of the memory modules 10, 26 have completed the at least one initialization sequence. As discussed, in other configurations the at least one first and second outputs 12, 24 may be received on separate inputs of the system memory controller 14, and the status of the at least one initialization sequence of each memory module 10, 26 may be monitored independently.

As discussed above, in certain embodiments in which more than one memory module 10, 26 is connected to the system memory controller 14, each memory module 10, 26 or associated controller circuit 18 (e.g., local memory controller) causes the corresponding notification circuit 20, 30 to drive the at least one output 12, 24 to the high impedance state from the low impedance state when it completes the requested or required operation. Thus, in certain such embodiments, the system memory controller 14 (e.g., MCH) can only pull the notifying signal high when all memory modules 10, 26 or associated controller circuits (e.g., local memory controllers) have completed the required or requested operation (e.g., initialization sequence). This configuration allows the system memory controller 14 (e.g., MCH) to work with a non-homogenous memory subsystem. For example, the system memory controller 14 may be able to monitor the progress of multiple memory modules 10, 26 including a mix of DIMMs or other memory modules having differing characteristics, such as DIMM density, rank configurations, DRAM density, speed, DRAM configuration, etc.

Additionally, the at least one output 12 of the first memory module 10 and the at least one second output 24 of the second memory module 26 are configured to be operatively coupled to at least one interrupt of the system memory controller 14 in certain embodiments. In certain such embodiments, the system memory controller 14 can be responsive to the second state of the first memory module 10 and the fourth state of the second memory module 26 by triggering execution of an interrupt routine by a processor of the system memory controller 14. For example, in the example system of FIG. 2, when the bus 32 is pulled high by the pull-up configuration 40 indicating the second state of the first memory module 10 and the fourth state of the second memory module 26, the system memory controller 14 triggers execution of the interrupt routine.

In some embodiments, in which the at least one first output 12 and the at least one second output 24 are operatively coupled to separate inputs of the system memory controller 14, the at least one first output 12 and the at least out second output 24 may be operatively coupled to two separate interrupts. For example, the system memory controller 14 may be responsive to the second state of the first memory module 10 by triggering execution of a first interrupt routine associated with a first interrupt, and may be responsive to the fourth state of the second memory module 26 by triggering execution of a second interrupt routine associated with the second interrupt. In yet other embodiments, the separate inputs of the memory controller 14 are internally operatively coupled to the same interrupt, or are operatively coupled to separate interrupts which trigger the same interrupt routine.

FIG. 3 shows a host computer system 16 including an example memory module 10 where the notification circuit 20 of the memory module 10 has another example configuration in accordance with certain embodiments described herein. In the example configuration of FIG. 3, the at least one first output 12 is operatively coupled to an error-out pin of the memory module 10, and a multiplexor 42 drives the transistor 36 with either of a task_in_progress signal 44 or an error signal 46 (e.g., parity error signal). In one embodiment, for example, the multiplexor 42 may be configured to drive the transistor 36 with the task_in_progress signal 44 when the memory module 10 is in the initialization mode or is executing the at least one initialization sequence, and with the error signal 46 when the memory module 10 is in the operational mode. Thus, the memory module 10 can be advantageously configured to both perform the standard (e.g., JEDEC-specified) error reporting functionality via the error-out pin during the operational mode and provide the status notification functionality during the system initialization mode, as described herein. As shown in FIG. 3, a second memory module 26 including a similar configuration can also be operatively coupled to the host computer system 16. In certain embodiments, the at least one second output 24 of the second memory module 26 can be operatively coupled to the at least one first output 12 by the bus 32, as described above (e.g., with respect to FIG. 2).

Figure 4:
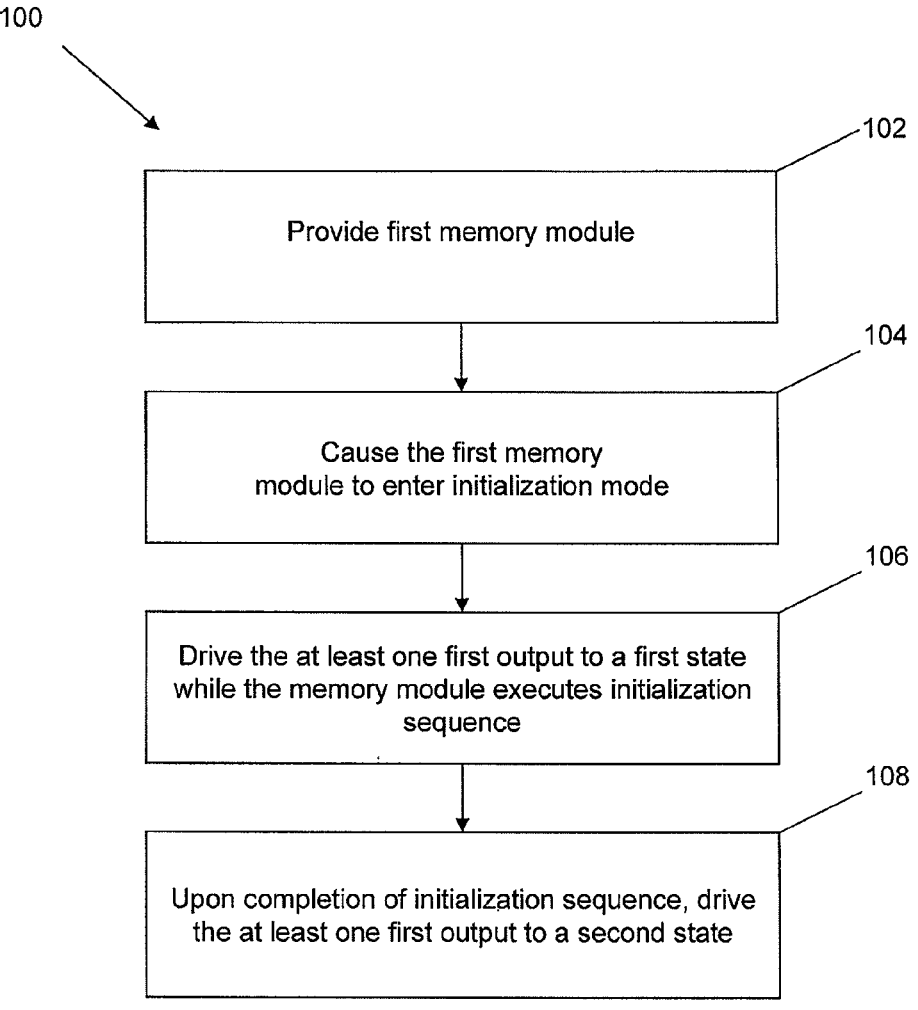
FIG. 4 and FIG. 5 show example methods of using at least one memory module according to certain embodiments described herein.

FIG. 4 shows an example method 100 of using the at least one memory module 10 in accordance with certain embodiments described herein. While the description below of the method 100 refers to structure shown in FIGS. 1-3, other structures may also be used in accordance with certain embodiments described herein. At block 102, the method 100 of certain embodiments comprises providing a first memory module 10 comprising at least one first output 12 operatively coupled to a memory controller 14 of a host computer system 16. The first memory module 10 can be configured to operate in at least two modes comprising an initialization mode during which the first memory module 10 executes at least one initialization sequence, and an operational mode. For example, the at least one initialization sequence may comprise one or more steps of a series of steps associated with an initialization procedure of the host computer system 16.

At block 104, the method 100 in some embodiments comprises causing the first memory module 10 to enter the initialization mode. At block 106, the method 100 of certain embodiments comprises driving the at least one first output 12 to a first state while the memory module 10 executes the at least one initialization sequence. Upon completion of the at least one initialization sequence, the method of certain embodiments comprises driving the at least one first output 12 to a second state different than the first state. In certain embodiments, the first state is a first logic level and the second state is a high impedance state. Additionally, in certain embodiments, the at least one first output 12 is operatively coupled to at least one interrupt of the memory controller 14 such that driving the at least one output 12 to the second state triggers the memory controller to execute an interrupt routine.

In certain embodiments, the at least one output 12 is operated in conformance with JEDEC standard when the first memory module 10 is in the operational mode, but is not operated in conformance with the JEDEC standard when the first memory module 10 is in the initialization mode. The at least one first output 12 of certain embodiments include an error-out pin of the first memory module, for example.

The method 100 can further include providing a second memory module 26 comprising at least one second output 24 operatively coupled to the memory controller 14. The second memory module 26 can be configured to operate in one of at least two modes comprising an initialization mode, during which the second memory module 26 executes at least one initialization sequence, and an operational mode. The method 100 can further include causing the second memory module 26 to enter the initialization mode. In certain embodiments, the method 100 also includes driving the at least one second output 24 of the second memory module 26 to a third state while the second memory module 26 executes the at least one initialization sequence. Upon completion of the at least one initialization sequence, the method 100 can further include driving the at least one second output 24 of the second memory module 26 to a fourth state different from the third state.

In certain embodiments, the at least one first output 12 of the first memory module 10 and the at least one second output 24 of the second memory module 26 are operatively coupled together by a bus 32 which is also operatively coupled to at least one input 34 of the memory controller 14. In certain other embodiments, the at least one first output 12 of the first memory module 10 is operatively coupled to a first input 34 of the memory controller 14 and the at least one second output 24 of the second memory module 26 is operatively coupled to a second input (not shown) of the memory controller 14.

Figure 5:
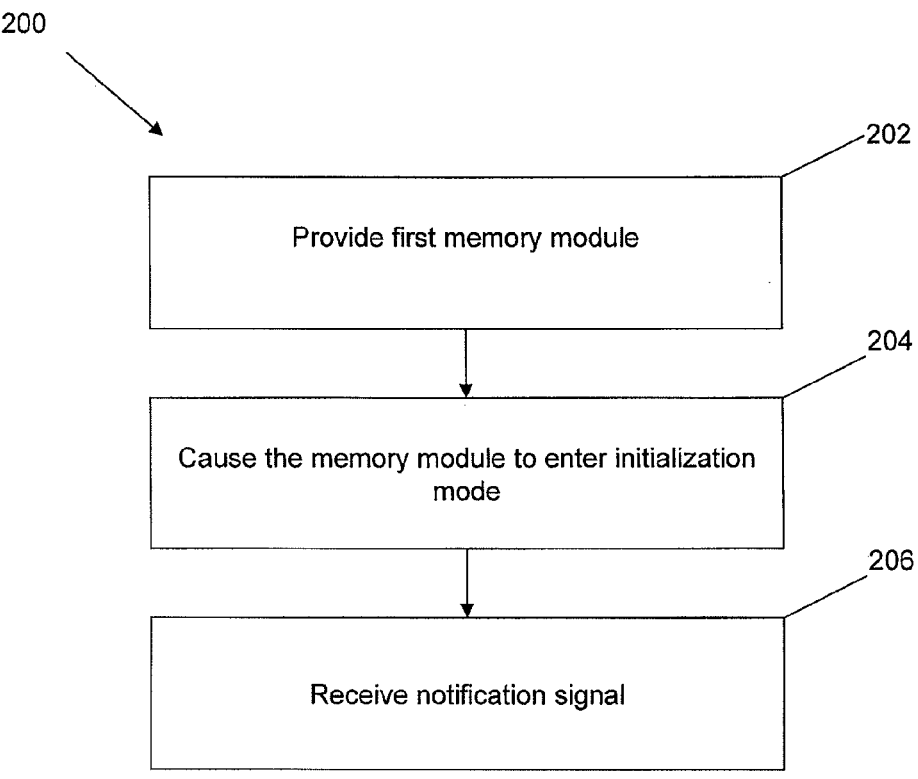

FIG. 5 shows another example method 200 of using at least one memory module 10 in accordance with certain embodiments described herein. At block 202, the method 200 may include providing a memory module 10 comprising at least one output 12 operatively coupled to a memory controller 14 of a host computer system 16. The memory module 10 may be configured to operate in at least two modes comprising an initialization mode, during which the memory module 10 executes at least one initialization sequence, and an operational mode.

The method 200 can further include causing the memory module 10 to enter the initialization mode at block 204. At block 206, the method 200 can include receiving a notification signal from the at least one output 12 of the memory module 10. The notification signal may indicate that the memory module 10 has completed the initialization sequence, for example. In certain embodiments, the method 200 further comprises executing an interrupt routine by the memory controller 14 in response to the notification signal.

Terminology/Alternative Embodiments

Embodiments have been described in connection with the accompanying drawings. However, it should be understood that the figures are not drawn to scale. Distances, angles, etc. are merely illustrative and do not necessarily bear an exact relationship to actual dimensions and layout of the devices illustrated. In addition, the foregoing embodiments have been described at a level of detail to allow one of ordinary skill in the art to make and use the devices, systems, etc. described herein. A wide variety of variation is possible. Components, elements, and/or steps can be altered, added, removed, or rearranged. While certain embodiments have been explicitly described, other embodiments will become apparent to those of ordinary skill in the art based on this disclosure.

Conditional language used herein, such as, among others, "can," "could," "might," "may" "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Depending on the embodiment, certain acts, events, or functions of any of the methods described herein can be performed in a different sequence, can be added, merged, or left out all together (e.g., not all described acts or events are necessary for the practice of the method). Moreover, in certain embodiments, acts or events can be performed concurrently, e.g., through multi-threaded processing, interrupt processing, or multiple processors or processor cores, rather than sequentially.

The various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks, modules, and circuits described in connection with the embodiments disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The blocks of the methods and algorithms described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, a hard disk, a removable disk, a CD-ROM, or any other form of computer-readable storage medium known in the art. An exemplary storage medium is coupled to a processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

Certain embodiments described herein are compatible with a memory system including memory devices with various attributes (see, e.g., FIGS. 2 and 3). For example, the memory system of certain embodiments may include various data slice sizes (e.g., two, four, eight, or 16 bit data slices) and corresponding memories (e.g., memories having two, four, eight, or 16 bit data widths).

Although certain embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence.

Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:

1. A memory subsystem operable with a system memory controller of a host system, the host system including a memory bus coupled to the system memory controller, the memory bus including control/address (C/A) signal lines, data signal lines, and an error signal line, the memory subsystem comprising:

a printed circuit board configured to be coupled to the system memory controller via the memory bus;

dynamic random access memory elements on the printed circuit board and operable to communicate data signals with the system memory controller; and a memory subsystem controller on the printed circuit board and operable to control the dynamic random access memory elements, the memory subsystem controller having an open drain output configured to be coupled to the error signal line, wherein the memory subsystem controller is further operable to provide a signaling interface to the system memory controller via the open drain output during normal memory read and write operations and a feedback path from the memory subsystem to the system memory controller via the open drain output for initialization operation sequences during an initialization operation;

wherein the memory subsystem controller is operable to output via the signaling interface a parity error signal in response to a parity error having occurred during any of the normal memory read and write operations;

wherein the memory subsystem controller is operable to output via the feedback path a first signal related to a first part of the initialization operation sequences and subsequently a second signal related to a second part of the initialization operation sequences, the first signal causing the open drain output to be at a low logic level for a first time period before returning to a high impedance state, the second signal causing the open drain output to be at the low logic level for a second time period before returning to the high impedance state, the second part of the initialization operation sequences being distinct from the first part of the initialization operation sequence, the second time period being distinct from the first time period and having a different duration from that of the first time period;

wherein, during each of the memory read and write operations, the memory subsystem is operable to output or receive data signals in response to respective C/A signals from the system memory controller, the C/A signals being transmitted via the C/A signal lines, the data signals being transmitted via the data signal lines; and wherein, during the initialization operation, the memory subsystem is not operable to respond to any C/A signals from the system memory controller by outputting to, or receiving from, the data signal lines any data signals.

2. The memory subsystem of claim 1, wherein the dynamic random access memory elements are not accessed by the system memory controller for any normal memory read or write operation during the initialization operation.

3. The memory subsystem of claim 2, wherein:
the memory subsystem controller includes a transistor having an open drain coupled to the open drain output, a source coupled to ground, and a gate;
the memory subsystem controller is operable to apply the parity error signal to the gate of the transistor to indicate the parity error having occurred during the any of the normal memory read and write operations; and
the memory subsystem controller is operable to apply the first signal to the gate of the transistor for the first part of the initialization operation sequences and to apply the second signal to the gate of the transistor for the second part of the initialization operation sequences.

4. The memory subsystem of claim 3, wherein the memory subsystem controller further includes a logic circuit having an output coupled to the gate of the transistor, a first input to receive the parity error signal, and a second input to receive the first signal and to receive the second signal, and wherein the memory subsystem controller is operable to couple the first input to the output for the normal memory read and write operations, and to couple the second input to the output for the initialization operation.

5. The memory subsystem of claim 4, wherein the memory subsystem controller comprises an integrated circuit that includes the logic circuit and the transistor.

6. The memory subsystem of claim 5, wherein the host system includes a plurality of slots each coupled to the memory bus, wherein the printed circuit board has edge connections that fit into a corresponding slot of the host system so as to be coupled to the system memory controller via the memory bus, the edge connections including first edge connections corresponding to the C/A signal lines, second edge connections corresponding to the data signal lines, and an open drain output pin corresponding to the error signal line and coupled to the open drain output.

7. The memory subsystem of claim 1, wherein:
the memory subsystem controller includes a transistor having an open drain coupled to the open drain output, a source coupled to ground, and a gate; wherein the memory subsystem controller is operable to apply the parity error signal to the gate of the transistor to indicate the parity error having occurred during the any of the normal memory read and write operations; and
the memory subsystem controller is operable to apply the first signal to the gate of the transistor as feedback for the first part of the initialization operation sequences and the second signal to the gate of the transistor as feedback for the second part of the initialization operation sequences.

8. The memory subsystem of claim 7, wherein the memory subsystem controller further includes a logic circuit having an output coupled to the gate of the transistor, a first input to receive the parity error signal, and a second input to receive the first signal and subsequently the second signal, and wherein the memory subsystem controller is operable to couple the first input to the output for the normal memory read and write operations, and to couple the second input to the output for the initialization operation.

9. A method of operation in a host system having a system memory controller, the host system including a memory bus coupled to the system memory controller, the memory bus including control/address (C/A) signal lines, data signal lines, and an error signal line, the method comprising:
at a memory subsystem coupled to the system memory controller via the memory bus, the memory subsystem including a printed circuit board, a memory subsystem controller on the printed circuit board, and dynamic random access memory elements on the printed circuit board, wherein the memory subsystem controller has an open drain output coupled to the error signal line, and is operable to provide a signaling interface to the system memory controller via the open drain output during normal memory read and write operations and a feedback path from the memory subsystem to the system memory controller via the open drain output during an initialization operation including initialization operation sequences,
outputting via the signaling interface a parity error signal in response to a parity error having occurred during any of the normal memory read and write operations; and
outputting via the feedback path a first signal related to a first part of the initialization operation sequences and subsequently a second signal related to a second part of the initialization operation sequences, the first signal causing the open drain output to be at a low logic level for a first time period before returning to a high impedance state, the second signal causing the open drain output to be at the low logic level for a second time period before returning to the high impedance state, the second part of the initialization operation sequences being distinct from the first part of the initialization operation sequence, the second time period being distinct from the first time period and having a different duration from that of the first time period;

wherein, during each of the memory read and write operations, the memory subsystem is operable to output or receive data signals in response to respective C/A signals from the system memory controller, the C/A signals being transmitted via the C/A signal lines, the data signals being transmitted via the data signal lines; and wherein, during the initialization operation, the memory subsystem is not operable to respond to any C/A signals from the system memory controller by outputting to, or receiving from, the data signal lines any data signals.

10. The method of claim 9, wherein the dynamic random access memory elements are not accessed for any normal memory read or write operation by the system memory controller during the initialization operation.

11. The method of claim 10, wherein the memory subsystem controller includes a transistor having an open drain coupled to the open drain output, a source coupled to ground, and a gate;

outputting to the signaling interface the parity error signal includes applying the parity error signal to the gate of the transistor to indicate the parity error having occurred during the any of the normal memory read and write operations; and outputting via the feedback path the first signal related to the first part of the initialization operation sequences and the second signal related to the second part of the initialization operation sequences includes applying the first signal to the gate of the transistor as feedback for the first part of the initialization operation sequences and applying the second signal to the gate of the transistor as feedback for the second part of the initialization operation sequences.

12. The method of claim 11, wherein the memory subsystem controller further includes a logic circuit having an output coupled to the gate of the transistor, a first input to receive the parity error signal, and a second input to receive the first signal and to receive the second signal, the method further comprising coupling the first input to the output for the normal memory read and write operations, and coupling the second input to the output for the initialization operation.

13. The method of claim 9, wherein the memory subsystem controller includes a transistor having an open drain coupled to the open drain output, a source coupled to ground, and a gate;

outputting to the signaling interface the parity error signal includes applying the parity error signal to the gate of the transistor to indicate the parity error having occurred during the any of the normal memory read and write operations; and outputting via the feedback path the first signal related to the first part of the initialization operation sequences and the second signal related to the second part of the initialization operation sequences includes applying the first signal to the gate of the transistor as feedback for the first part of the initialization operation sequences and applying the second signal to the gate of the transistor as feedback for the second part of the initialization operation sequences.

14. The method of claim 13, wherein the memory subsystem controller further includes a logic circuit having an output coupled to the gate of the transistor, a first input to receive the parity error signal, and a second input to receive the first signal and to receive the second signal, the method further comprising coupling the first input to the output for the normal memory read and write operations, and coupling the second input to the output for the initialization operation.

15. The memory subsystem of claim 1, wherein the host system further includes one or more other memory subsystems coupled to the system memory controller via the memory bus, and wherein the memory subsystem is not operable to output any signal related to any part of the initialization operation sequences to any of the one or more other memory subsystems during the initialization operation.

16. The memory subsystem of claim 1, wherein each of the first signal and the second signal is a non-timing critical signal.

17. A memory subsystem operable with a system memory controller of a host system, the host system including a memory bus coupled to the system memory controller, the memory bus including control/address (C/A) signal lines, data signal lines, and an error signal line, the memory subsystem comprising:

a printed circuit board configured to be coupled to the system memory controller via the memory bus;

dynamic random access memory elements on the printed circuit board and operable to communicate data signals with the system memory controller; and a memory subsystem controller on the printed circuit board and operable to control the dynamic random access memory elements, the memory subsystem controller having an open drain output configured to be coupled to the error signal line, wherein the memory subsystem controller is further operable to provide a signaling interface to the system memory controller via the open drain output during normal memory read and write operations and a feedback path from the memory subsystem to the system memory controller via the open drain output for initialization operation sequences during an initialization operation;

wherein the memory subsystem controller is operable to output via the signaling interface a parity error signal in response to a parity error having occurred during any of the normal memory read and write operations;

wherein the memory subsystem controller is operable to cause the open drain output to transition from a high impedance state to a low logic level and to stay at the low logic level for a first time period before returning to the high impedance state as feedback for a first part of the initialization operation sequences, and the memory subsystem controller is further operable to cause the open drain output to transition from the high impedance state to the low logic level and to stay at the low logic level for a second time period before returning to the high impedance state as feedback for a second part of the initialization operation sequences, the second part of the initialization operation sequences being distinct from the first part of the initialization operation sequences, the second time period being distinct from the first time period and having a different duration from that of the first time period;

wherein, during each of the memory read and write operations, the memory subsystem is operable to output or receive data signals in response to respective C/A signals from the system memory controller, the C/A signals being transmitted via the C/A signal lines, the data signals being transmitted via the data signal lines;

wherein, during the initialization operation, the memory subsystem is not operable to output to or receive from the data signal lines any data signals in response to any C/A signals from the system memory controller, or to output any signal related to any part of the initialization operation sequences via any signal line in the memory bus other than the error signal line.

18. The memory subsystem of claim 17, wherein the memory subsystem controller includes a transistor having an open drain coupled to the open drain output, a source coupled to ground, and a gate;

wherein the memory subsystem controller is operable to apply the parity error signal to the gate of the transistor to indicate the parity error having occurred during the any of the normal memory read and write operations; and wherein the memory subsystem controller is operable to apply a first signal to the gate of the transistor as feedback for the first part of the initialization operation sequences and to apply a second signal to the gate of the transistor as feedback for the second part of the initialization operation sequences.

19. The memory subsystem of claim 18, wherein the memory subsystem controller further includes a logic circuit having an output coupled to the gate of the transistor, a first input to receive the parity error signal, and a second input to receive the first signal and to receive the second signal, and wherein the memory subsystem controller is operable to couple the first input to the output for the normal memory read and write operations, and to couple the second input to the output for the initialization operation.

* * * * *